United States Patent [19]

Tenner et al.

[11] Patent Number: 5,673,101

[45] Date of Patent: Sep. 30, 1997

[54] METHOD OF REPETITIVELY IMAGING A MASK PATTERN ON A SUBSTRATE, AND APPARATUS FOR PERFORMING THE METHOD

[75] Inventors: Manfred G. Tenner; Jan E. van der Werf; Cornelis M. J. van Uijen; Peter Dirksen, all of Eindhoven, Netherlands

[73] Assignee: U.S. Philips Corporation, New York, N.Y.

[21] Appl. No.: 450,197

[22] Filed: May 25, 1995

[30] Foreign Application Priority Data

Jun. 2, 1994 [EP] European Pat. Off. ............ 94201577

[51] Int. Cl.⁶ .................................................. G03B 27/42
[52] U.S. Cl. ...................... 355/53; 355/55; 355/61; 355/564; 355/56; 356/401
[58] Field of Search .................................. 355/53, 55, 61, 355/54, 56; 356/401, 372, 394, 329

[56] References Cited

U.S. PATENT DOCUMENTS

| | | | |
|---|---|---|---|
| 4,251,160 | 2/1981 | Bouwhuis et al. | 356/401 |
| 4,356,392 | 10/1982 | Wittekoek et al. | 250/201 |
| 4,640,619 | 2/1987 | Edmark, III | 356/372 |
| 4,737,823 | 4/1988 | Bouwer et al. | 355/53 |
| 4,741,622 | 5/1988 | Suwa et al. | 356/401 |
| 4,778,275 | 10/1988 | van der Brink et al. | 356/401 |
| 4,875,076 | 10/1989 | Torigoe et al. | 355/53 |
| 5,100,237 | 3/1992 | Wittekoek et al. | 356/401 |
| 5,124,927 | 6/1992 | Hopewell et al. | 364/468 |
| 5,144,363 | 9/1992 | Wittekoek et al. | 355/53 |
| 5,191,200 | 3/1993 | van der Werf et al. | 250/201.4 |

FOREIGN PATENT DOCUMENTS 0498499  8/1992  European Pat. Off. .

OTHER PUBLICATIONS

J. Wangler & J. Liegel, "Design principles for an illumination system using an excimer laser as a light source", SPIE vol. 1138, 1989, pp. 129–136.

Primary Examiner—Arthur T. Grimley
Assistant Examiner—Shival Virmani
Attorney, Agent, or Firm—Daniel E. Tierney

[57] ABSTRACT

A method and apparatus for repetitively imaging a mask pattern (C) on a substrate (W) are described. Various parameters of the apparatus and the projection lens system (PL) can be measured accurately and reliably and measuring devices of the apparatus can be calibrated by measuring a latent image of a mark by means of a scanning microscope (LID) forming a diffraction-limited radiation spot (Sp) on the photoresist layer on the substrate (W), in which layer the latent image is formed by means of a projection beam (PB).

14 Claims, 10 Drawing Sheets

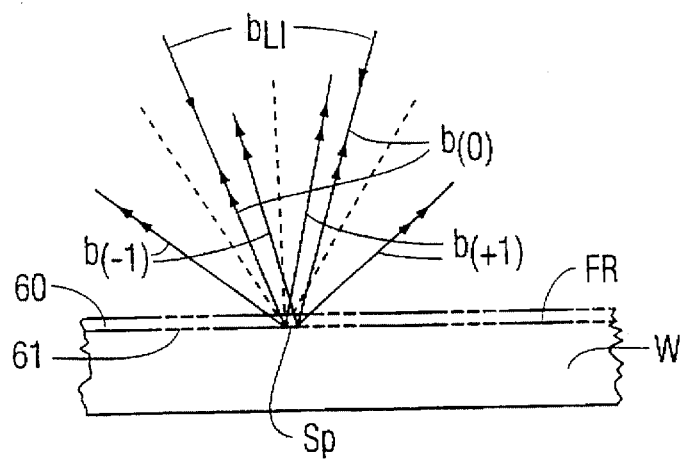
FIG. 7
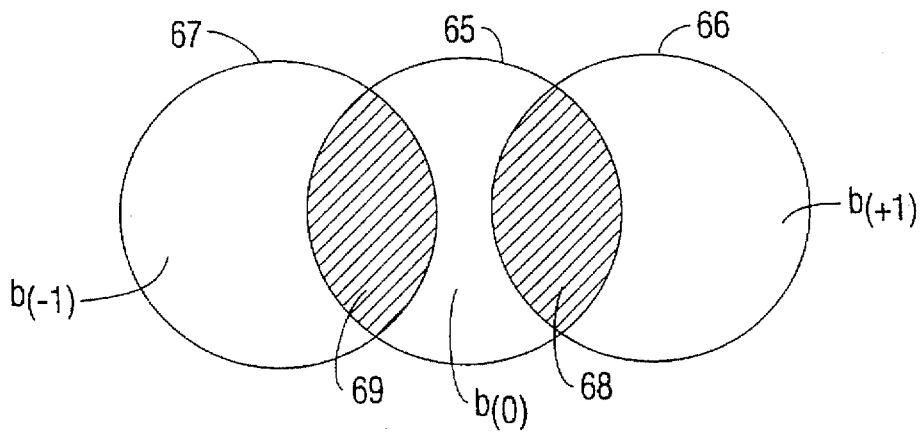
FIG. 8
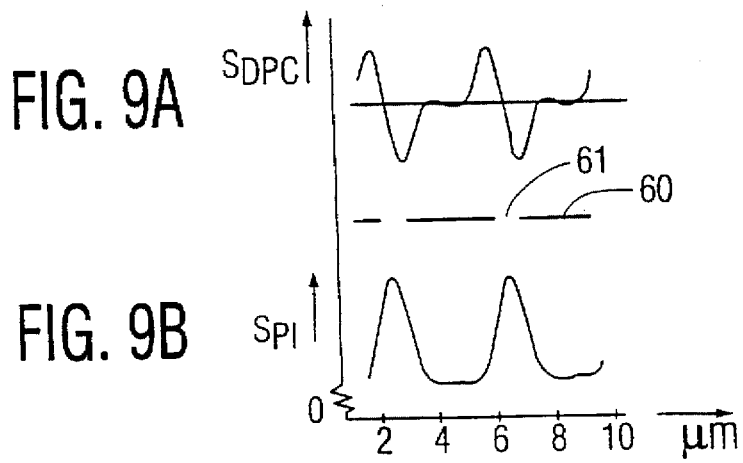
FIG. 9A
FIG. 9B

METHOD OF REPETITIVELY IMAGING A MASK PATTERN ON A SUBSTRATE, AND APPARATUS FOR PERFORMING THE METHOD

The invention relates to a method of repetitively imaging a mask pattern, provided in a mask table, on a substrate provided in a substrate table, by means of a projection beam, which method comprises the following steps:

providing a mask having at least one test mark in the mask table;

providing a substrate having a photoresist layer in the substrate table;

projecting the image of at least one test mark of the mask in the photoresist layer by means of the projection beam and a projection lens system;

detecting the latent image of at least one test mark by means of a latent-image detection device in which non-actinic radiation is used;

setting at least one parameter influencing the quality and position of the mask pattern image by means of the output signal of the latent-image detection device, and repetitively imaging a production mask pattern at consecutive, different positions on a production substrate.

The invention specifically also relates to an apparatus for repetitively imaging a mask pattern, which is present in a mask, on a substrate, which apparatus successively comprises an illumination system for supplying a projection beam, a mask table, a projection lens system and a substrate table, and which is further provided with a latent-image detection device.

BACKGROUND OF THE INVENTION

Such a method and apparatus for repetitively imaging an IC mask pattern on IC production substrates are known from U.S. Pat. No. 5,124,927. As described in this Patent, a test mask can be provided in the apparatus and imaged on a test substrate or a production substrate before a start is made with the production and projection process, i.e. the formation of production mask pattern images on production substrates. The projection beam radiation which is incident via the mask on the photoresist layer provided on the substrate causes a change of the refractive index in this layer in accordance with a pattern which corresponds to the pattern of the mask. This pattern in the photoresist layer which is not yet developed is referred to as latent image. This latent image can be observed by means of a phase contrast microscope because the differences in refractive index result in differences in reflection and also cause phase differences in a beam reflected by the photoresist layer and the substrate. As described in U.S. Pat. No. 5,124,927, the latent image can be used for various purposes, notably for global alignment of the mask with respect to the substrate and for controlling critical line widths in the mask pattern image, for controlling the quantity of radiation energy, the focusing of the projection beam on the photoresist layer and variations in the image due to temperature variations. Instead of being formed on a test substrate, latent images can also be formed on a production substrate in which the number of IC patterns which can be formed on the substrate is reduced by the number of latent images formed on this substrate for control purposes.

The advantage of latent-image detection is that the alignment and controls can be performed in the apparatus itself and that, unlike previous practice, it is no longer necessary to remove the substrate with the test mask image from the apparatus, to develop this substrate and to examine it by means of, for example a scanning electron microscope, which is time-consuming and during which examination the apparatus cannot be used.

In the apparatus described in U.S. Pat. No. 5,124,927 a polarization interference microscope in the form of a Nomarski differential interference contrast microscope is used for the latent-image detection device. This microscope has an objective lens which re-images the entire latent image on a composite detector such as a CCD (charge-coupled device) sensor or a vidicon with which the re-image is scanned for obtaining an electric signal which represents the latent image. The resolving power of a Nomarski microscope is determined by that of its objective lens. Since this lens must have a large image field, its numerical aperture is limited. Since, moreover, the wavelength of the radiation used in the microscope should be sufficiently large, because this radiation may not produce any effect in the photoresist layer, in other words, it should be non-actinic, the resolving power of the Nomarski microscope is limited. Moreover, the quality of the image formed on the scanning detector is influenced by errors in the objective lens. The Nomarski microscope is also a relatively large instrument which must be placed at a relatively large distance from the projection lens so that a substrate provided with a latent image is to be displaced over a relatively large distance for inspection of the latent image. Moreover, instabilities, for example in the form of vibrations which impair the accuracy of the inspection may occur in the Nomarski microscope.

SUMMARY OF THE INVENTION

It is an object of the present invention to provide a novel concept for latent-image detection which does not have the above-mentioned drawbacks and in which a large resolving power can be achieved. The invention further relates to extending the number of possibilities of use of the latent image and of the detection device which is primarily intended for latent-image detection.

The method according to the invention in which this concept is realised is characterized in that a diffraction-limited scanning spot is used for the latent-image detection and in that this spot and the latent image are moved with respect to each other for point-by-point scanning of the latent image.

Since the detection is realised point by point, a small image field, for example of the order of 100 µm and consequently a test beam having a relatively large aperture may be used, so that a detection having a high resolving power will be possible. Since the latent image is no longer re-imaged, the detection is no longer influenced by the imaging quality of the lens.

If the mask pattern, i.e. the production mask pattern, for example an IC pattern has a suitable structure, for example a sufficient extent of periodicity or has otherwise sufficiently recognizable structural elements, this pattern may be used as a test mark.

The method may also be characterized in that the latent-image detection uses a production mask which is provided with at least one test mark.

This test mark may be optimized for obtaining a latent-image detection signal.

For obtaining a great degree of freedom in the choice of the positions of the latent images on the substrate, hence in measuring possibilities, the method according to the invention is further characterized in that the latent-image detection uses a test mask which is provided with at least one test mark.

After performing measurements on and/or by means of latent images, this test mask is replaced by a production mask.

A first embodiment of the method according to the invention is further characterized in that a plurality of images of a test mark is formed in the photoresist layer, each time at a different focus setting of the projection lens system, and in that the optimum focus of the projection lens system is determined from the variation of the output signals of the latent-image detection device obtained when scanning each of said images.

The optimum focus before projecting a production mask pattern on a production substrate can be set by means of the information thus obtained.

As will be described hereinafter, the latent image can be detected in different manners. The variation of the output signal is dependent on the detection method used, but it is also dependent on the spatial frequencies occurring in the latent-image structure. Dependent on the detection method used and on the frequencies in the latent-image detection, the modulation depth of the output signal, for example for higher frequencies or the distances between zero crossings of the output signal, for example for lower frequencies, can be measured. The term signal variation is understood to mean both the modulation depth and said distances.

The first embodiment may be further characterized in that the optimum focusing signal obtained via the latent-image detection is compared with a focus-measuring signal obtained by means of a separate focus-measuring device and used for calibrating the last-mentioned signal.

The separate focus-measuring device may be implemented as described in U.S. Pat. No. 4,356,392. In this device a focus-measuring beam bypassing the projection lens system is directed obliquely on the substrate and the beam reflected by the substrate is received by a position-sensitive focus detector. The distance between the substrate and the projection lens system with which the focus-measuring device is connected can be determined from the position of the spot of the chief ray of the reflected focus-measuring beam on the detector. This focus-measuring device is used to measure the distance during the production projection process and to correct possible focus errors with reference to the measured result. Instead of this focus-measuring device, other known devices such as, for example those described in U.S. Pat. No. 5,191,200 may be used.

A second embodiment of the method according to the invention is characterized in that a plurality of images of a test mark is formed in the photoresist layer, each time with a different exposure dose, in that the optimum quantity of exposure dose is determined by measuring the variation of the output signal of the latent-image detection device obtained when scanning each of the images, and in that the information thus obtained is used for setting the exposure dose for the production projection process.

This provides the possibility of a direct and accurate measurement of the influence of the quantity of exposure dose on the mask pattern image to be formed in the substrate. The exposure dose is understood to mean the total radiation energy which is taken up by the substrate when one image is being formed. This energy may be applied in a pulsed form.

A third embodiment of the method according to the invention is characterized in that a plurality of images of a test mark is formed in a plurality of areas of the photoresist layer, inter alia at the edges of said layer, each time at a different focus setting of the projection lens system, in that the optimum focus value is determined for each of said areas by measuring the variation of the output signals of the latent-image detection device obtained when scanning each of said images in said areas, and in that the optical properties of the projection lens system are determined by comparing the optimum focusing values for the different areas.

In this way, various parameters of the projection lens system such as curvature of the image field and astigmatism can be determined. The projection lens system can be corrected by means of the results of these measurements.

In connection with the large number of electronic components per surface unit of the substrate and the consequent small dimensions of these components, increasingly stricter requirements are imposed on the accuracy with which integrated circuits are manufactured. The positions where the successive production masks are imaged on the production substrate must therefore be fixed more and more accurately. Due to the smaller depth of field of the projection lens with which smaller details can be imaged, it should also be possible to focus more accurately.

To be able to realise the desired, very great positioning accuracy within several tenths of a micrometer, of the image of the mask pattern with respect to the production substrate, the projection apparatus comprises a device for aligning the production substrate with respect to the production mask pattern, with which an alignment mark provided in the production substrate is imaged on an alignment mark provided in the production mask. If the image of the substrate alignment mark accurately coincides with the mask alignment mark, the production substrate is aligned correctly with respect to the production mask pattern. The main element for imaging the production substrate mark on the production mask mark is constituted by the projection lens system with which the production mask pattern is imaged on the production substrate.

This projection lens system is designed and optimally corrected for the wavelength of the projection beam. This wavelength is as small as possible so as to be able to image the smallest possible details at an equal numerical aperture in the projection lens system. In the current projection apparatuses, this wavelength is, for example 365 nm with which line widths of approximately 0.7 µm can be imaged. The aligning beam, i.e. the beam used in the aligning device has such a wavelength that the photoresist layer on the production substrate is insensitive thereto so that such a beam cannot cause a change in the photoresist layer provided on the substrate and cannot be attenuated by this layer. This aligning beam is, for example a helium-neon laser beam having a wavelength of 633 nm. In spite of the fact that the aligning beam wavelength is not adapted to the projection lens system, the alignment marks of the production mask and the production substrate can still be aligned correctly with respect to each other if the path of only the aligning beam incorporates a correction element, for example a lens.

However, the problem remains that, due to different wavelengths of the projection beam and the aligning beam, variations of, for example ambient parameters such as temperature have a different effect on the images which are formed with the projection beam and the aligning beam, respectively. As a result, the aligning device may detect a satisfactory mutual alignment of the alignment marks associated with this device, whereas the mask image formed with the projection beam is not positioned correctly with respect to the substrate. A mechanical drift may also occur in the projection apparatus, which drift cannot be detected by means of the aligning device. It is therefore necessary to calibrate the conventional aligning system periodically, for example once or several times a day.

An embodiment of the method according to the invention with which this can be realised is further characterized in that at least one latent image is formed in the photoresist layer, each at a defined position, a first alignment signal representing the extent to which the mask and the substrate are aligned with respect to each other is generated by means of these images and the latent-image detection device, in that said alignment signal is compared with a second alignment signal originating from a separate aligning device and is used for calibrating the last-mentioned device.

Since the mask is provided with a test mark as well as alignment marks, the conventional aligning device can be tested with reference to the alignment measuring result of the latent-image detection device.

Thus, not only the focus-measuring device but also the aligning device can be coupled to the latent-image detection device via a computer which processes the signals of said devices to control signals for, inter alia focusing and alignment.

The embodiment of the method in which the latent image is used for calibrating the aligning device may be further characterized in that the latent-image detection device is used for scanning at least one alignment mark on the substrate. Then it is not necessary to impose strict requirements on the mutual positioning and stability of the latent-image detection device and the aligning device. Then use is made of the fact that the latent-image detection device is suitable for performing different types of measurements.

The latent-image detection device used for the method according to the invention is preferably provided with an autofocusing system with which the scanning beam is always sharply focused on the photoresist layer. Consequently, the size of the scanning spot can be maintained minimal and constant and, moreover, other measurements can be performed.

This embodiment may, for example, be further characterized in that the detection device and a photoresist layer which is not provided with images are moved with respect to each other in a plane perpendicular to the optical axis of the detection device, and in that a tilt of the photoresist layer with respect to said plane is determined from a movement of the objective system along its optical axis.

Before an image is formed on the photoresist layer, a possible tilt of the photoresist layer can be corrected by means of this measurement by adapting the holder for this layer.

By making use of the novel method of detecting a latent image, this image may also be used for measurements other than those mentioned hereinbefore.

For example, by scanning one and the same latent image a plurality of times and by comparing the measuring results obtained in the different scanning operations at smaller or larger intervals, the influence of ambient parameters such as air pressure or temperature on the servomeasuring systems of the projection apparatus such as the substrate table interferometer system can be determined.

Another possibility is to position the latent-image detection device above one latent image and to measure possible fluctuations in the output signal of this device. These fluctuations give an indication about, inter alia vibrations of the holder for the photoresist layer.

If the mask test mark is composed of lines, the positions of lines in the latent image can be determined by combining the output signal of the latent-image detection device and the signal of the substrate table interferometer system. Information about the distortion of the projection lens system can then be obtained.

The apparatus according to the invention, in which the novel concept is realised, is characterized in that the latent-image detection device is constituted by a scanning optical microscope comprising a radiation source supplying a non-actinic test beam, an objective system for focusing the test beam to a scanning spot in a photoresist layer present on the substrate, scanning spot position detection means for detecting the position of the scanning spot in the plane of the substrate, and a radiation-sensitive detection system having at least one detector whose surface area is of the order of the image of the scanning spot formed in the detector plane with the detection system being intended for converting the test beam radiation from the photoresist layer into an electric signal which represents the local refractive index of the photoresist layer at the location of the scanning spot.

By moving the test beam and the substrate provided with a latent image with respect to each other through an area of the order of the latent image, this image is scanned point by point by the test beam. The objective system each time images a pointed sub-area of the latent image on the detector so that this system only needs a small image field and the system may thus have a large numerical aperture of the order of, for example 0.5. A diffraction-limited radiation spot having a small diameter, for example of the order of 1 μm can be formed with such an objective system so that the detection device has a large resolving power.

A preferred embodiment of the latent-image detection device is further characterized in that the radiation source is a semiconductor diode laser, the objective system is constituted by a single lens element, at least one refractive surface of which is aspherical, and in that the radiation path between the diode laser and the objective system incorporates a beam-separating element for separating the test beam radiation, reflected by the substrate, from the radiation supplied by the diode laser and for directing the reflected radiation towards the detection system.

This detection device, which is already used for reading optical record carriers such as the known CD audio and CD-ROM discs, may have a very compact structure and may therefore be very stable of itself. An aspherical lens surface is understood to mean a surface whose fundamental shape is spherical or plane but whose real shape deviates to a small extent from the fundamental shape so as to correct for spherical aberrations of the fundamental shape of the lens.

As will be further described, various modifications of the detection device, which are known in the field of optical information storage systems, can be used for detecting latent images.

As already noted, the latent-image detection device must be provided with scanning spot position detection means so as to relate the instantaneous value of the detector output signal to an instantaneous position in the latent image. These means may be constituted by, for example a multi-axis interferometer for determining the instantaneous position of the detection device if this device itself is moved for scanning the latent image. The scanning spot position detection means may alternatively be constituted by position detection means for detecting the position of a movable element such as a rotating polygon mirror with which the scanning spot is moved across the substrate if the detection device itself is stationary and only the test beam is moved.

However, optimum use is made of the fact that the detection device is small and can be placed close to the projection lens system in an embodiment of the apparatus which is characterized in that the scanning spot position detection means are constituted by a multi-axis interferometer system which is present for moving and positioning a production substrate accurately with respect to a production mask during the production projection process.

The multi-axis, for example 3-axis or 5-axis interferometer system, an embodiment of which is described in European Patent Application no. 0 498 499 and which has been designed to displace and position a production substrate with respect to a production mask with very great accuracy, for example of the order of 2.5 nm, is also very suitable for very accurately displacing the substrate with a latent image with respect to the detection device. This suitability and the large resolving power of the detection device yield a very accurate and reliable detection of the latent image.

The projection apparatus is adapted in such a way that the entire surface of a substrate can be brought within the image field of the projection lens system by moving the substrate table. Since the latent-image detection device can be placed close to the projection lens system, almost the entire substrate surface can be scanned so that also latent images, which are provided at a relatively large distance from the centre of the substrate, can be measured.

BRIEF DESCRIPTION OF THE DRAWING FIGURES

These and other aspects of the invention will be apparent from and elucidated with reference to the embodiments described hereinafter.

In the drawings

FIGS. 7 and 8 show the principle of the differential phase contrast measurement which can be performed in this device;

FIG. 9 shows the variation of the differential phase contrast signal and the variation of the integrated pupil signal;

DESCRIPTION OF INVENTION FEATURES

Figure 1B:
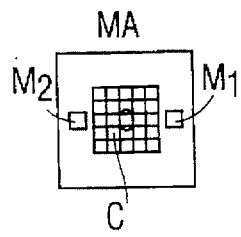
FIG. 1 shows diagrammatically an embodiment of an apparatus for repetitively imaging a mask pattern on a substrate.
Figure 1A:
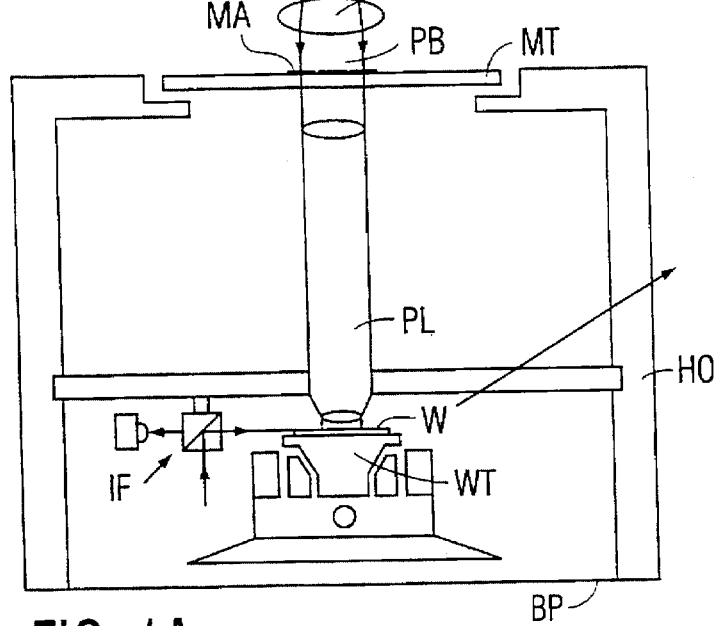
Figure 1C:
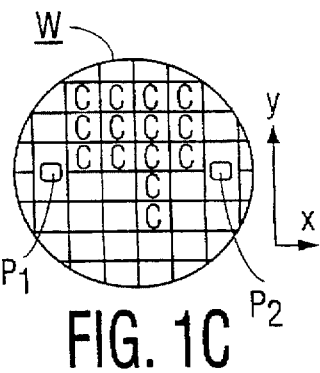

FIG. 1 shows diagrammatically a known embodiment of an apparatus for repetitively imaging a mask pattern on a substrate. The main components of this apparatus are a projection column in which a mask pattern C to be imaged is provided, and a movable substrate table WT with which the substrate can be positioned with respect to the mask pattern C.

The projection column incorporates an illumination system comprising, for example a laser LA, a beam widener $E_x$, an element IN, also referred to as integrator which realises a homogeneous distribution of radiation within the projection beam PB, and a condensor lens CO. The projection beam PB illuminates the mask pattern C present in the mask MA which is provided on a mask table MT.

The beam PB passing through the mask pattern C traverses a projection lens system PL which is arranged in the projection column and is only shown diagrammatically and which forms images of the pattern C on the substrate W. The projection lens system has, for example a magnification M of ⅕, a numerical aperture N.A. of 0.6 and a diffraction-limited image field having a diameter of 22 mm.

The substrate W is arranged on a substrate table WT which is supported, for example by air bearings. The projection lens system PL and the substrate table WT are arranged in a housing HO, the lower side of which is closed by a base plate BP of, for example granite and the upper side by the mask table MT.

As is shown in FIG. 1, the mask MA has, for example two alignment marks $M_1$ and $M_2$. These marks preferably consist of diffraction gratings but may alternatively be formed by other marks such as squares or strips which are optically distinguished from their surroundings. The alignment marks are preferably two-dimensional, i.e. they extend in two mutually perpendicular directions, the X and Y-directions in FIG. 1. The substrate W, for example a semiconductor substrate on which the pattern C is to be imaged a number of times next to each other, comprises a plurality of alignment marks, preferably again two-dimensional diffraction gratings, two of which, $P_1$ and $P_2$ are shown in FIG. 1. The marks $P_1$ and $P_2$ are located outside the areas on the production substrate W where the images of the pattern C must be formed. The grating marks $P_1$ and $P_2$ are preferably phase gratings and the grating marks $M_1$ and $M_2$ are preferably amplitude gratings.

For the way in which and the device with which the mask and the substrate are aligned with respect to each other by means of the mask and substrate marks, reference is made to U.S. Pat. Nos. 4,773,275 and 5,100,237 describing embodiments of aligning systems.

The projection apparatus is further provided with a focus servodevice comprising a focus-error detection device for detecting a deviation between the image plane of the projection lens system and the plane of the production substrate during the repetitive imaging of a production mask on a production substrate. When such a deviation occurs, the focusing can be corrected by means of the signal supplied by the focus-error detection device, for example by displacing the projection lens along its optical axis.

Figure 2:
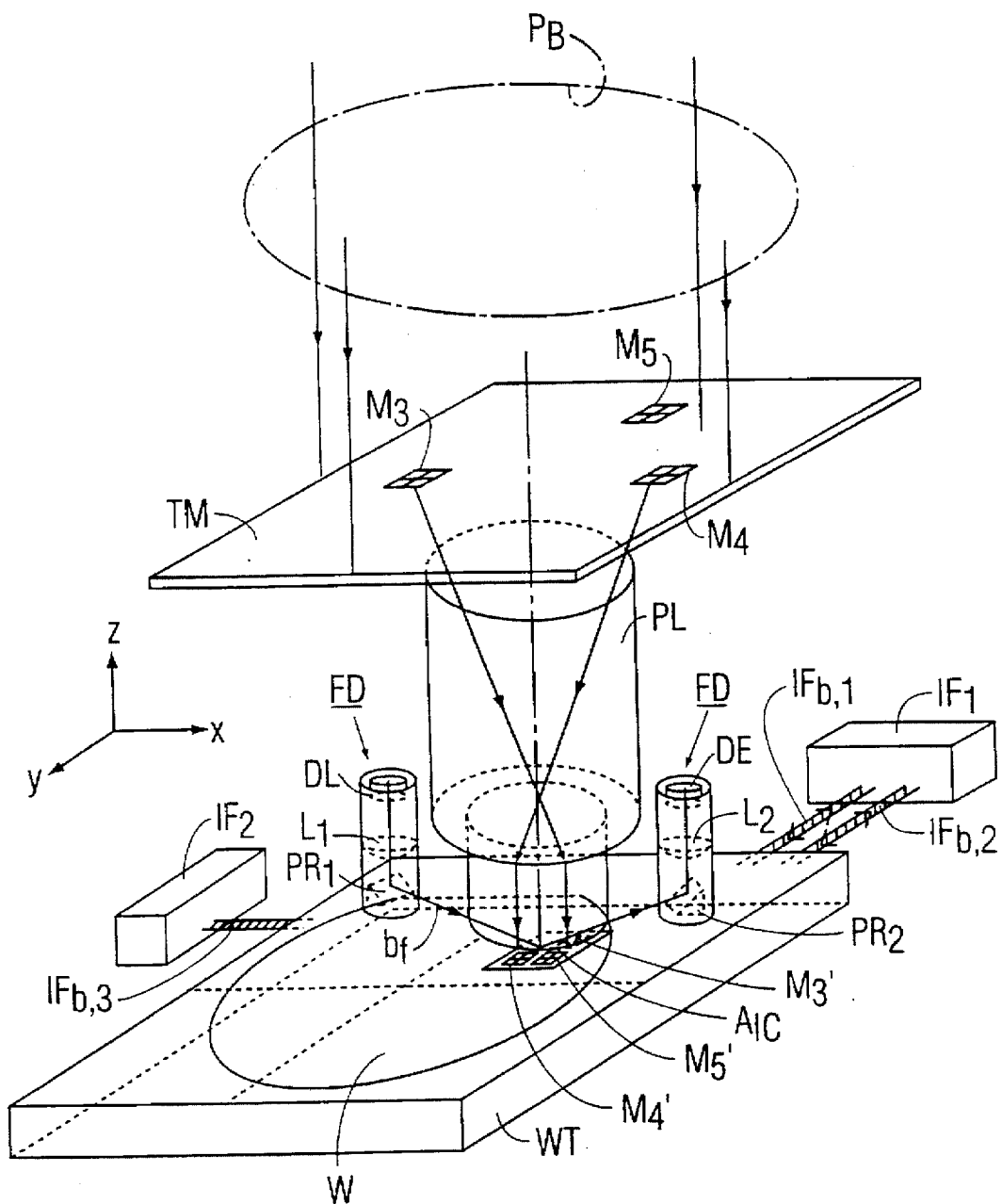
FIG. 2 shows the focus-error detection device and the substrate table position detection device of the projection apparatus.

The focus-error detection device FD is shown diagrammatically in FIG. 2. This Figure also shows the position detection device for the substrate table, which device comprises, for example two parts $IF_1$ and $IF_2$.

The focus-error detection device FD comprises a radiation source, for example a diode laser DL which supplies a focusing beam $b_f$ and a prism $PR_1$ which reflects this beam towards a point on the substrate W coated with a photoresist layer, where the optical axis of the projection lens system intersects this plate. For the sake of simplicity only the chief ray of this beam is shown. For the sake of brevity the combination of substrate and photoresist layer is hereinafter referred to as substrate. A lens $L_1$ arranged between the diode laser DL and the prism $PR_1$ focuses the beam to a radiation spot on the substrate. The beam $b_f$ reflected by the substrate is reflected by a second prism $PR_2$ to a radiation-sensitive detector DE. A lens $L_2$ between the prism $PR_2$ and the detector images the radiation spot formed on the substrate on the detector DE. When the distance between the projection lens system and the substrate is changed in the Z-direction, the radiation spot formed on the detector DE moves in the detector plane. Since the detector is a position-sensitive detector or consists of two separate detection elements, the displacement of the radiation spot and the corresponding focus error can be determined. The information thus obtained can be used for correcting, for example the Z position of the substrate table WT by means of a known parallelogram construction shown diagrammatically in FIG. 3. The different elements of the focus-error detection device are arranged in two, for example cylindrical holders which are rigidly secured to the holder of the projection lens system.

As described in U.S. Pat. No. 4,356,392, the position of the detector DE may be occupied by a reflector which ensures that the focusing beam is reflected a second time by the substrate before it is incident on a detector. This preferred embodiment of the focus-error detection device has the advantage that the focus-error measurement is not influenced by tilt of the substrate or by local reflection differences of this substrate. The focus-error detection device may also be implemented as described in U.S. Pat. No. 5,191,200 and then operates with a beam having a wide wavelength band, which beam images a first grating via the substrate on a second grating.

For very accurately determining the X and Y-positions of the substrate table, the projection apparatus is provided with a composite interferometer system consisting of, for example two parts. The part $IF_1$ emits one or more beams in the Y-direction towards a reflective side face of the substrate table and also receives the reflected beams. The X-position of the table can be determined thereby. Analogously, the Y-position of the substrate table can be detected by means of the interferometer part $IF_2$. The interferometer system may be implemented as described in U.S. Pat. No. 4,251,160 and then operates with two beams. Instead of this two-axis interferometer system, a three-axis system as described in U.S. Pat. No. 4,737,823 or a multi-axis system as described in European Patent Application 0 498 499 can be used.

By using the substrate table position detection device or interferometer system, the positions of and the mutual distances between the alignment marks $P_1$ and $P_2$, and $M_1$ and $M_2$ can be fixed during alignment in a system of coordinates defined by the interferometer system. It is then not necessary to have a reference with respect to the frame of the projection apparatus or a component of this frame so that variations in this frame due to, for example temperature variations, mechanical creepage and the like do not have any influence on the measurements.

Figure 3:
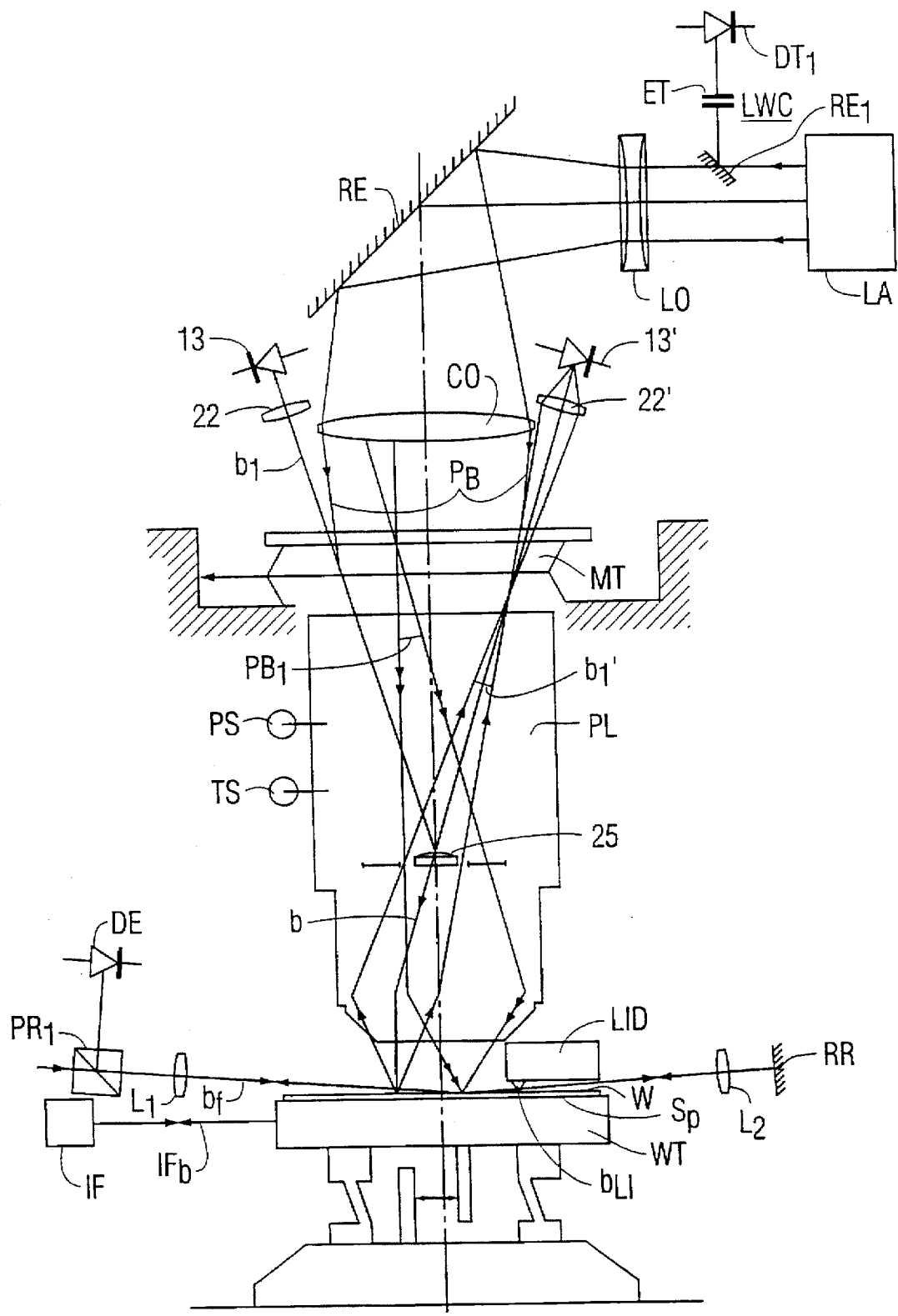
FIG. 3 is a cross-section of a projection apparatus provided with an alignment detection system.

To gain a better insight into the projection apparatus, this apparatus is once more shown in FIG. 3, this time in a cross-section. The illumination system has a slightly different structure from that in FIG. 1 and comprises a laser LA, for example a krypton-fluoride laser, a lens system LO, a reflector RE and a condensor lens CO. The illumination system is provided with a known system LWC which is diagrammatically shown, with which the wavelength of the laser radiation can be controlled. The system LWC is described in the article "Design Principles for an Illumination System using an Excimer Laser as a Light Source" in: SPIE vol. 1138 (1989), pp. 121, etc.

For the sake of simplicity FIG. 3 also shows a double alignment detection device, indicated by an incident beam b and the two exiting aligning beams $b_1$ and $b_1$, and by the elements 25, 13, 13', 22 and 22'. The operation of this device and the functions of the various elements are described in U.S. Pat. Nos. 5,144,363 and 5,100,237.

FIG. 3 further shows a focus-error detection device with lenses $L_1$ and $L_2$ and a retroreflector RE which reflects along itself a focusing beam $b_f$ entering from the left and being reflected a first time by a production substrate or a test substrate. The reflected beam $b_f$ is reflected to the detector DE by the partially transparent prism $PR_1$.

The beam $IF_b$ coming from the block IF diagrammatically indicates that the apparatus is provided with an interferometric substrate table position detection device.

The reference symbols PS and TS denote a pressure sensor and a temperature sensor, respectively.

Figure 4:
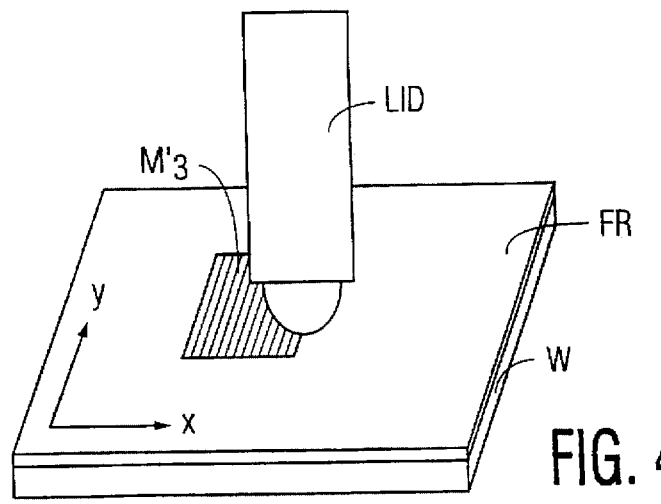
FIG. 4 shows diagrammatically a latent image and a detection device for this image.

To be able to measure the settings of the apparatus and the quality of the projection lens system, a mask having at least one test mark is provided in the projection apparatus and this mask is imaged in the photoresist layer of a substrate, as is shown in FIG. 2. This mask may be a separate test mask TM. However, the test mark may also be provided on a production mask outside the mask pattern C. It is further possible under circumstances to use a part of the mask pattern of a production mask as a test mark. By way of example, it has been assumed in FIG. 2 that this mask comprises three test marks $M_3$, $M_4$ and $M_5$. When the test mask is illuminated by the projection beam, test mark images $M'_3$, $M'_4$ and $M'_5$ are formed in the photoresist layer of the substrate. These images are located in an area $A_{IC}$ of the substrate covering an area in which one IC is formed during the production projection process. FIG. 2 shows this area exaggerated with respect to the substrate. The test marks preferably consist of a periodical line pattern because this provides a considerable signal interpolation so that a great measuring accuracy can be achieved. However, also other periodical or non-periodical patterns which may have all kinds of shapes such as squares, rectangles or crosses may be used as test marks. When the test mark patterns are imaged in the photoresist layer, corresponding patterns of strips alternately having a higher and a lower refractive index are produced in this layer. FIG. 4 shows one of these patterns, $M'_3$. In this Figure, the reference symbol W denotes the substrate and Fr denotes the photoresist layer provided on this substrate.

According to the invention, such a pattern is measured with a scanning optical microscope. This microscope is denoted by the block LID in FIGS. 3 and 4 and the associated measuring beam is denoted by $b_{LI}$. This measuring beam is focused to a measuring spot SP in the photoresist layer Fr. During the measurement, the measuring spot SP and the substrate are moved with respect to each other in the X-direction.

DESCRIPTION OF PREFERRED EMBODIMENTS

Figure 5:
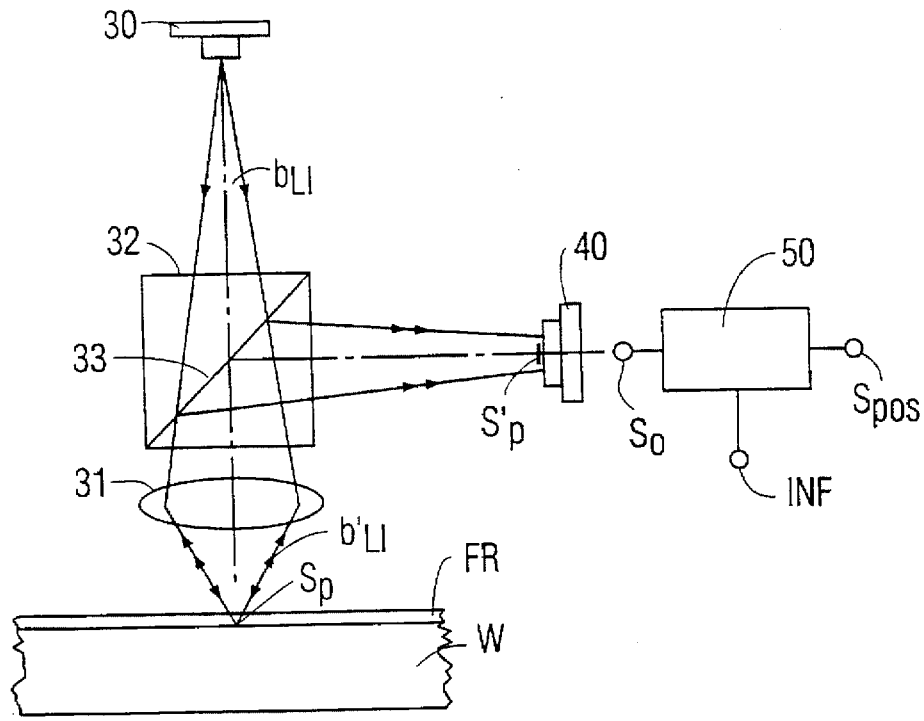
FIG. 5 shows a first embodiment of the latent-image detection device.

FIG. 5 shows a first embodiment of the scanning microscope LID. This microscope comprises a coherent radiation source, for example a diode laser 30 which emits the measuring beam $b_{LI}$. This beam is focused by an objective system 31 to a preferably diffraction-limited spot SP in the photoresist layer FR. The half-value width of this spot is, for example of the order of 1 μm while the period in the test mark image (M'$_3$) is, for example 2 μm. The beam $b'_{LI}$ reflected by the photoresist layer is reflected by a beam separator, for example a partially transmissive layer 33 in a prism 32 to a photosensitive detector 40. Instead of a partially transmissive layer, the combination of a polarization-sensitive beam splitter and a λ/4 plate, in which λ is the wavelength of the beam $b_{LI}$, may also be used as a beam separator. In the microscope of FIG. 5 all radiation of the reflected beam $b'_{LI}$ passing through the pupil of the objective system 31 is concentrated on a single detector 40 which converts this signal into an electric output signal So. This detection method is denoted by Pupil Integration (PI) method. When the scanning spot Sp is moved across the test mark image transversely to the strips of this image, i.e. in the X-direction of FIG. 4, the signal So varies periodically because the scanning spot successively meets strips having a higher and strips having a lower refractive index. These refractive index differences result, inter alia in the successive strips alternately having a higher and a lower reflection coefficient. The variation of the signal So, for example the modulation depth of this signal is dependent on the quantity of radiation received by the photoresist layer which has contributed to activation of this layer and on, for example the extent of focusing this beam in the photoresist layer FR.

In an electronic processing unit 50 the signal So together with a signal Spos, which indicates the position of the scanning spot with respect to the test mark image, can be processed to information INF about the positions of the strips in this image and the distance between these strips.

Figure 6:
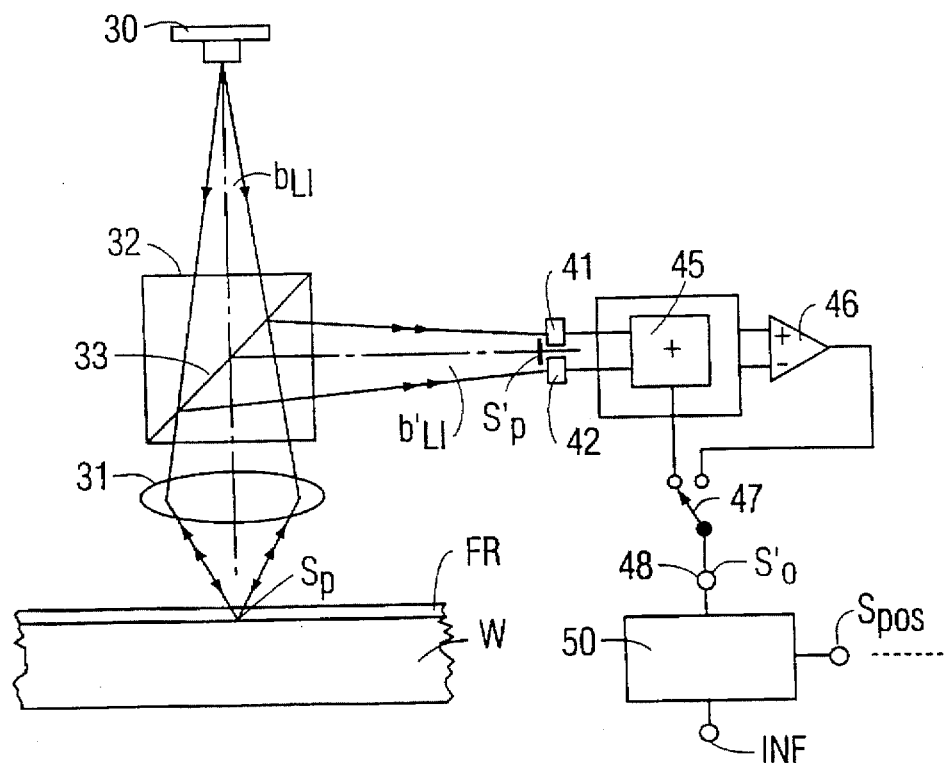
FIG. 6 shows a second embodiment of this device.

In the illuminated strips not only the reflection coefficient but also the refractive index is smaller than in the non-illuminated strips. Radiation coming from the illuminated strips consequently has passed a different optical path length than radiation coming from non-illuminated strips. The test mark image thus also has a phase structure. The details of this structure cannot only be detected by means of the PI method but also by means of the differential phase contrast (DPC) method. The radiation portions of the reflected beam $b'_{LI}$ which pass through a first and a second pupil half of the objective system are then received by a first and a second detector element, respectively. FIG. 6 shows an embodiment of the latent-image detection device in which this method is used. The detector elements are denoted by 41 and 42. In the DPC method use is made of the fact that diffraction occurs at the interface between an illuminated strip and a non-illuminated strip. The reflected beam $b'_{LI}$ is then split into, inter alia a zero-order sub-beam b(0), a sub-beam b(+1) of the +1 order and a sub-beam b(−1) of the −1 order as is shown in FIG. 7. In this Figure the non-illuminated strips are denoted by 60 and the illuminated strips are denoted by 61. The sub-beams b(+1) and b(−1) are deflected at equally large but opposite angles. The chief ray of the reflected sub-beam b(0) has a direction which is opposed to that of the incident beam $b_{LI}$. Of the higher order sub-beams, for example b(+2), b(−2), such a small quantity reaches the detectors that these sub-beams can be ignored.

Portions of the sub-beams b(+1) and b(−1) pass through the pupil of the objective system 31 as is shown in FIG. 8, which Figure shows a cross-section in the plane of this pupil. The circle 65 represents the pupil and also the cross-section of the zero-order beam, while the circles 66 and 67 represent the cross-sections of the beams b(+1) and b(−1). The portions of the first-order sub-beams which pass through the pupil interfere with the zero-order sub-beam, as is shown by way of the shaded areas 68 and 69 in FIG. 8. These areas are imaged on the detector elements 41 and 42, respectively. The intensities of the beam portions incident on these elements are determined by the phase differences between the beam b(0) on the one hand and the sub-beams b(+1) and b(−1) on the other hand. The phase differences vary periodically when the scanning spot SP and the strip structure are moved with respect to each other. If the centre of this spot coincides with the centre of an illuminated strip 61, the phase differences for the sub-beams b(+1) and b(−1) are equal and hence the detectors 41 and 42 have equal intensities. For example, the output signal So then has the value of zero. If the scanning spot moves to the left or right with respect to the strip structure, the phase difference for one of the first-order sub-beams, hereinafter referred to as first sub-beam, increases and the phase difference for the other first-order sub-beam, hereinafter referred to as the second sub-beam, decreases until the centre of the radiation spot has reached the interface with a non-illuminated strip 60. Then the phase difference is maximal for the first sub-beam and minimal for the second sub-beam and the output signal So is, for example maximally negative. When the scanning spot is further moved with respect to the strip structure, the phase difference for the first sub-beam decreases and the phase difference for the second sub-beam increases until the entire radiation spot covers the non-illuminated strip 60. Then the output signal is zero again. This continues until the radiation spot approaches the interface with a subsequent illuminated strip 61. Then the phase difference for the first sub-beam decreases and reaches a minimum value when the centre of the scanning spot coincides with the interface while the phase difference for the second sub-beam has then increased to a maximum value. The output signal So is then maximally positive. subsequently this signal decreases again to the zero level when the centre of the scanning spot is located on the centre of the illuminated strip. Thus, an output signal is obtained which is denoted by $S_{DPC}$ in FIG. 9. For the purpose of comparison, this Figure also shows the signal $S_{PI}$, i.e. the signal obtained of the same test mark image by means of the PI method (FIG. 5). The distance is plotted in μm along the horizontal axis in FIG. 9, which distance has been covered by the scanning spot from a given reference position centrally on a non-illuminated strip 60, and the value of the output signal $S_{DPC}$ and $S_{PI}$ is plotted in arbitrary units on the vertical axis. Only the centres of the illuminated strips 63 for which the signal $S_{PI}$ is maximum can be detected by means of the PI method, while the $S_{DPC}$ method can detect the interface between illuminated and non-illuminated strips, and conversely. In principle, the DPC signal has a better signal-to-noise ratio than the PI signal. For detecting latent images having a smaller spatial frequency, the PI method is preferably used, while latent images having higher spatial frequencies are preferably detected by means of the DPC method.

The signal curves of FIG. 9 apply to a test mark image for which the widths of the non-illuminated strips are approximately three times as large as those of the illuminated strips.

If these widths are approximately equal and the period of the strip structure is smaller than twice the diameter of the scanning spot, for example smaller than 1.8 μm at a spot diameter of 1.1 μm, the signals $S_{DPC}$ and $S_{PI}$ both have a sinusoidal variation, the one sine being 90° shifted with respect to the other.

As is shown in FIG. 6, both detection methods can be incorporated in a detection device. To this end the outputs of the detection elements are connected to a summing device 45 and a differential amplifier 46. It is determined by means of a switch 47 whether the signal from the summing device or from the differential amplifier is passed on to an output 48. This output is connected to an electronic processing circuit to which the scanning spot position signal Spos is applied to obtain information about the positions of the strips in the test mark image or about the distance between these strips.

The contrast of the latent image, formed in the photoresist layer, of a test mark comprising a plurality of strips, which may be assumed to be a grating, depends on the quantity of radiation energy which is absorbed by the photoresist layer and is used for activating this layer. The quantity of energy which is applied to this layer is linearly dependent on the radiation power of the source LA (FIGS. 1 and 2) and on the time interval during which a shutter present in the projection apparatus is open. The energy quantity which is absorbed by the photoresist layer depends on the reflection coefficient of the assembly of layer and substrate. The larger this reflection coefficient, the less energy is available for activating the photoactive component in this layer. The optical thickness of this layer, i.e. the product of its geometrical thickness and its refractive index also determines the reflection coefficient. To be able to produce satisfactory images of the mask pattern with the aid of the projection apparatus it is therefore necessary to directly measure the quantity of energy absorbed by the photoresist layer.

To this end the modulation depth of the DPC signal or the PI signal obtained by means of the latent-image detection device according to the invention can be used.

Figure 10:
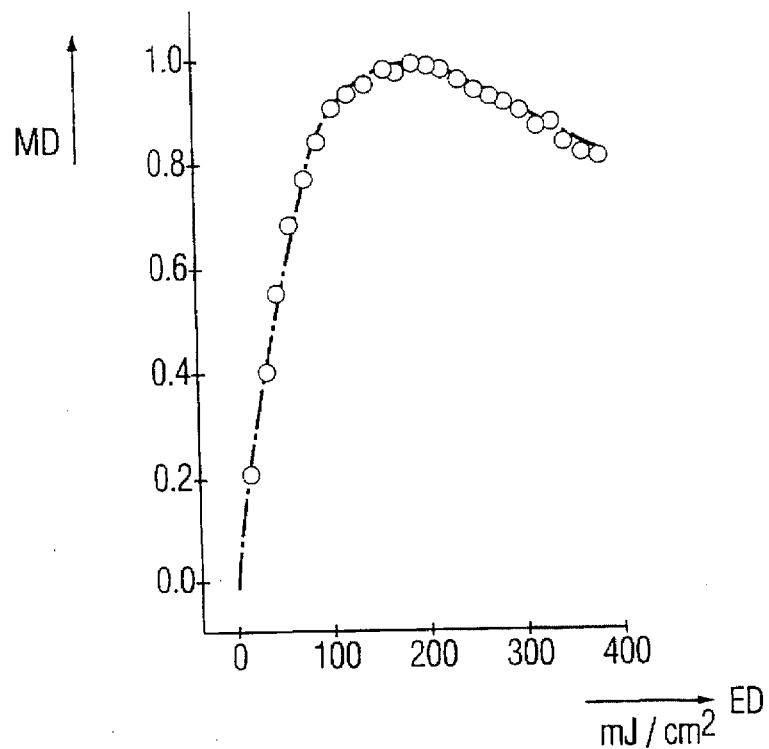
FIG. 10 shows the variation of the output signal of the latent-image detection device as a function of the exposure dose.

The measurement is realised by forming a plurality of images one test mark in the photoresist layer, each time with a different exposure dose (by choosing the shutter time and setting the lamp intensity) and all latent images are scanned to obtain the associated DPC signals. By comparing the modulation depths of these signals, it is determined which latent image has a maximum modulation depth. An optimum exposure dose for the production projection process can be derived from the associated exposure dose. FIG. 10 shows by way of example how the modulation depth MD varies with the exposure dose for a latent grating image having a period of 1 μm. The modulation depth is shown in arbitrary units again. The dots in this Figure indicate measured values, while the dot-and-dash curve represents a computer simulation.

The modulation depth of the DPC signal (or PI signal) may also be used for determining the optimum focusing of the projection lens system. If the projection lens system is not sharply focused on the photoresist layer, the image of a test mark formed by means of this system has a reduced contrast. For a latent image having strips which are sufficiently narrow with respect to the resolving power of the projection lens system, the modulation depth of the DPC signal is a satisfactory measure of the focusing. By forming a plurality of latent images of one test mark having a sufficiently small period in the photoresist layer, each time at a different focus setting of the projection lens system, and by comparing the modulation depths of the DPC signals obtained from these images, the optimum focusing value can be determined.

Figure 11:
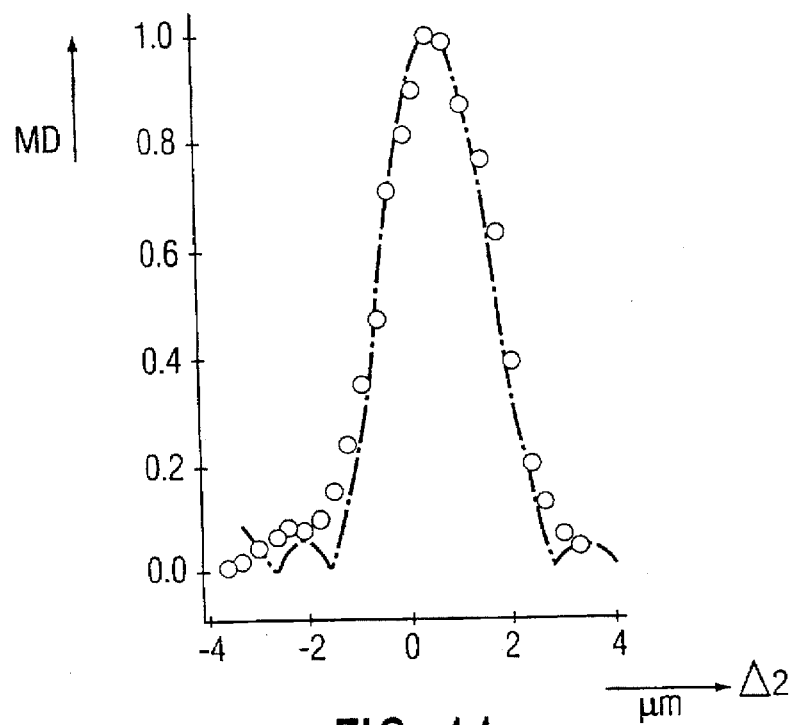
FIG. 11 shows the variation of this signal as a function of focus setting.

FIG. 11 shows by way of example how the modulation depth MD varies at a variation ΔZ of the distance between the projection lens system and the photoresist layer for a latent grating image having 0.5 μm wide illuminated and non-illuminated strips. The modulation depth, shown in arbitrary units, is maximum for the optimum focus, ΔZ=0 and will be smaller as ΔZ increases. The dots in FIG. 11 represent measured values, while the dot-and-dash curve represents a computer simulation.

The result of a focus measurement on a latent image can be used for setting the focus of the projection lens system before a production projection process is started or at given calibration moments in such a process. During the production projection process the focus may, however, vary, particularly in the novel projection lens systems which have a high resolving power and a relatively large image field. Line widths of the order of 0.4 μm in an image field of the order of 25 mm can be imaged with these projection lens systems, but these systems are very sensitive to variations of the ambient parameters such air pressure and temperature. Due to the high dispersion of the lens material, a variation of the wavelength of the projection beam influences the imaging quality, i.e. the position and the quality of the image formed with this beam. Problems with third-order distortion, image astigmatism and curvature of the image field may arise in the projection apparatus. The novel-generation projection lens systems having a very high resolving power and a relatively large image field have a very small depth of field so that focus errors, inter alia due to larger wavelength dependence of the projection lens system, have an increasing influence. These errors should be detected very accurately.

To this end the projection apparatus comprises a focus-error detection device FD as described with reference to FIGS. 2 and 3. Since the focus-measuring beam $b_F$ has a wavelength which is considerably different from that of the projection beam, variations of, for example ambient parameters such as temperature have a different effect on the images formed with the projection beam and the focus-measuring beam, respectively. Consequently, a satisfactory focusing may be measured with the focus-error detection device, but the image of the mask formed by means of the projection beam is not sharp. A mechanical drift which cannot be detected by means of a focus-error detection device may also occur in the projection apparatus. It is therefore necessary to calibrate the focus-error detection device periodically, for example once or several times a day.

The results of the focus measurements on latent images can be used for this calibration. To this end measurements are also carried out by means of the focus-error detection device during scanning of each latent image. The results of these measurements are stored in a memory. After it has been determined which latent image is sharpest, the focus value measured by the focus-error detection device for this image is looked up. If this value does not correspond to the value measured with the latent-image detection device, the zero point of the focus-error detection device can be adapted.

In the focus measurement described above, a plurality of test marks located at sufficiently large mutual distances in the test mask can be simultaneously imaged several times, each time at different focus settings. By scanning the associated latent images, the optimum focus value for each test mark can be determined. By comparing the optimum focus values thus obtained for the different marks, data about the quality of the projection lens system can be obtained in the manner as described in U.S. Pat. No. 5,144,363 which describes a projection apparatus with an image sensor of a different type.

Moreover, information about the distortion of the projection lens system may be derived from the values, obtained by means of the latent-image detection device, of the distances between the strips of a latent image.

As already noted, the projection apparatus comprises a conventional aligning device with which alignment marks on a production substrate and alignment marks on a production mask, hence the production mask and the production substrate, are aligned with respect to each other. This aligning device also cooperates with the substrate table interferometer system. For calibrating this aligning device, the latent-image detection device can be used again. To this end a test mask or a production mask which is provided with at least a test mark is arranged in the projection column, each at a well-defined position, and imaged in the photoresist layer by the projection beam. By means of the latent-image detection device and the substrate table interferometer system the optimum alignment of the substrate with respect to the mask is fixed. Moreover, it is determined by means of the conventional aligning device whether the alignment marks which are also present in the mask are also aligned with the alignment marks which are present in the substrate. When a deviation is found, preferably the zero point of the output signal of the conventional aligning device is corrected.

It should then be ensured that the last-mentioned device is stable with respect to the latent-image detection device in order that the signals from these devices can be compared correctly. By also detecting the substrate alignment marks by means of the latent-image detection device, the requirement for mutual stability of this device and the aligning device can be alleviated.

In the above-mentioned measurements the position of the scanning spot of the latent-image detection device is present on the photoresist layer should be very accurately controlled. Unlike the device shown in FIGS. 3 and 6, the detection device may be provided with, for example a rotating mirror polygon which moves the measuring beam across the photoresist layer. In this device a part of the measuring beam originating from the polygon can be split up and passed as a reference beam to, for example a reference grating so as to perform a movement across this grating synchronous with the scanning spot movement. By measuring the position of the reference beam spot with respect to the reference grating, the position of the scanning spot on the photoresist layer is also known.

However, a latent-image detection device using a stationary measuring beam, as shown in FIGS. 5 and 6, is preferably used and the substrate table is moved for scanning a latent image. Then the very accurate interferometric substrate table position detection device may also be used to measure the position of the scanning spot of the latent-image detection device. The advantage of the device shown in FIGS. 5 and 6 is that it may be very compact, for example, it may have a width of approximately 22 mm and a height of, for example 16 mm so that it can be easily built into the projection apparatus. An even more important aspect is that this device can be placed close to the projection lens system so that it can be used substantially throughout the substrate area covered by the projection lens system and also latent images at the edges of the substrate can be detected.

Moreover, the latent-image detection device has the advantage that it has a high resolving power because a small scanning spot is formed and that it is very stable.

In the projection apparatus in which the latent-image detection device according to the invention is used, use is made of the recognition that not all separate parameters influencing the imaging quality should be precisely known, but that the image quality and the image position as a whole should be known and that, for a measured deviation from this quality and position, the measuring signals can be simultaneously processed in a computer and via a model which comprises all parameters and their mutual relations so as to form control signals for correcting one or more of the apparatus parameters in such a way that the image acquires the desired quality and position.

The conventional focus detection device, the aligning device and the substrate table position detection device are coupled together via the latent-image detection device, so that an integrated measuring system is obtained with which all relevant parameters can be measured.

Figure 12:
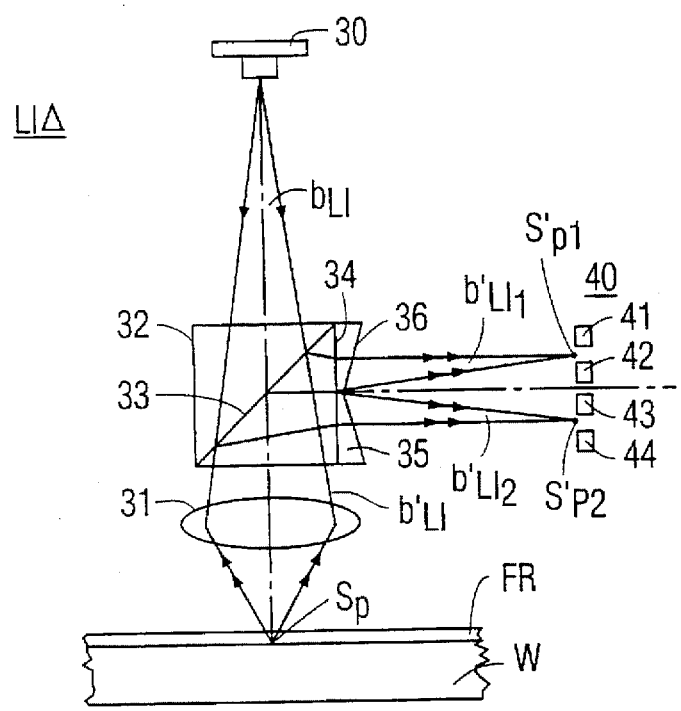
FIG. 12 shows an embodiment of a latent-image detection device provided with a focus-error detection device.

The latent-image detection device is preferably provided with a focus-error detection system so as to measure the focusing of the measuring beam $b_{LI}$ on the photoresist layer. FIG. 12 shows an embodiment of such a device. A double wedge 34 having wedge faces 35 and 36 is arranged on the exit plane of the beam-separating prism 32. This wedge splits the beam $b'_{LI}$ reflected by the prism 34 into two sub-beams $b'_{LI1}$ and $b'_{LI2}$ which are focused to the radiation spots $SP'_1$ and $SP'_2$. The radiation-sensitive detector 40 now comprises four detection elements 41, 42, 43 and 44. If the beam $b_{LI}$ is sharply focused on the photoresist layer FR, the radiation spots $SP'_1$ and $SP'_2$ are round and these spots are located symmetrically with respect to the detector elements 41 and 42, and 43 and 44, respectively. Then the detector elements 41 and 42 on the one hand and the detector elements 43 and 44 on the other hand receive an equal quantity of radiation. The focus error signal $S_f$ which is given by $S_f=(S_{41}+S_{44})-(S_{42}+S_{43})$ is then, for example zero. Upon defocusing, the radiation spots $Sp'_1$ and $Sp'_2$ become asymmetrically larger and the points of gravity of the intensity distribution within these spots move away from each other or towards each other, dependent on the sign of defocusing. Then the outer detectors 41 and 44 receive more radiation than the inner detectors, or conversely, and the focus error signal $S_f$ is positive or negative.

Figure 13:
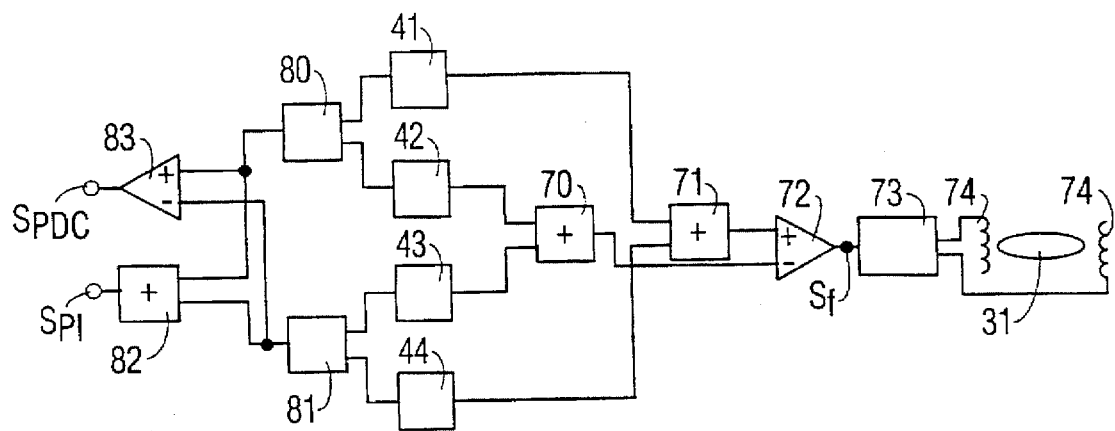
FIG. 13 shows a signal processing circuit associated with this embodiment.

FIG. 13 shows an embodiment of a signal processing circuit for deriving the focus error signal $S_f$ from the detector element signals. This circuit comprises a first summing device 70 for adding the signals S42 and S43 and a second summing device 71 for adding the signals S41 and S44. The outputs of these summing devices are connected to the inputs of a differential amplifier 72, at whose output the signal $S_f$ appears. This signal is processed in a control circuit 73 to a control signal with which, for example a loudspeaker coil 74 in which the objective has been suspended is energized. The objective position is controlled in such a way that the signal $S_f$ is minimal.

As is shown in the left-hand part of FIG. 13, the latent image DPC signal, $S_{DPC}$, can be obtained by adding the signals S41 and S42 in a summing device 80 and the signals S43 and S44 in a summing device 81 and by applying the output signals of these summing devices to the inputs of a differential amplifier 83. The latent image PI signal, $S_{PI}$, is obtained by adding these signals S41, S42, S43 and S44 together by means of, for example the summing devices 80, 81 and 82.

The autofocusing latent-image detection device of FIG. 12 may be used as an altitude meter for a blank substrate in which no structure is provided, with which meter unevennesses in the substrate can be measured. By, for example inductively or capacitively measuring the deflections of the objective system 31 during scanning of the entire substrate in the PI mode and by relating these deflections to the instantaneous position of the scanning spot SP, a topographic chart of the substrate can be made.

By similarly scanning a blank substrate, but then in the DPC mode of the device, the tilt of the substrate with respect to the detection device can be determined. The tilt angle can be determined at an accuracy of approximately 0.1 mrad.

The result of the tilt measurement can be used to give the substrate a horizontal position by means of a known system of, for example three vertical actuators in the substrate table.

Two further measurements can be performed with the latent-image detection device, whose outcomes give indications about the behaviour of the projection apparatus, for example when ambient parameters are changing. The first measurement implies that the same latent image is scanned several times in succession in the DPC mode. The time intervals between the scanning operations may be chosen to be, for example larger and larger so as to get an impression about the long-term stability of the apparatus. By determining the average positions of the zero-crossings of the DPC signals for each of the scanning operations and by comparing these positions with each other, long-term variations (of several minutes) in the apparatus settings which, converted into positions in the latent image are several nms, can be measured, which variations may be caused by air pressure or temperature variations. By comparing said zero-crossings within one scanning operation, short-term variations may be measured.

The second measurement implies that the scanning spot of the latent-image detection device is placed above a latent image in such a way that the DPC signal is zero, which means that the centre of the scanning spot is present above the centre of a strip. The substrate table is held in place by means of the interferometer system. By checking whether there are still variations in the output signal of the image detection device, it can be ascertained whether there is still troublesome electronic noise in this device or "mechanical noise" in the substrate table.

Figure 14:
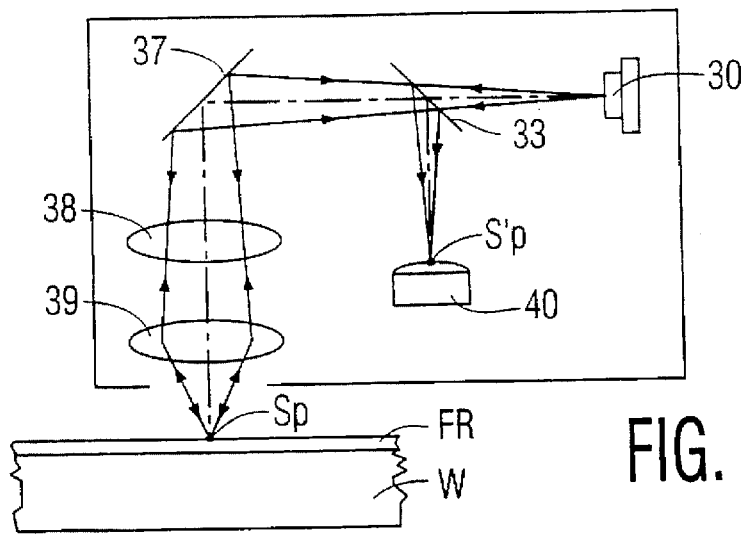
FIGS. 14, 15 and 16 show further embodiments of the latent-image detection device.

FIGS. 5, 6 and 12 show the principle of a latent-image detection device with a special focus-error detection device, whose longitudinal direction is vertical. As has already been shown in FIG. 3, the longitudinal direction is preferably horizontal so that the device can be placed close to and even partly under the projection lens system PL. FIG. 14 shows such an embodiment of the device. This device not only comprises the diode laser 30, the beam separator 33 and the detector 40, but also an extra reflector 37 which rotates the direction for the laser beam through 90° so that this beam is incident on the photoresist layer FR. Moreover, a combination of a collimator lens 38 and an objective lens 39 is used, for example instead of an objective lens (31 in FIGS. 5, 6 and 12).

Figure 15A:
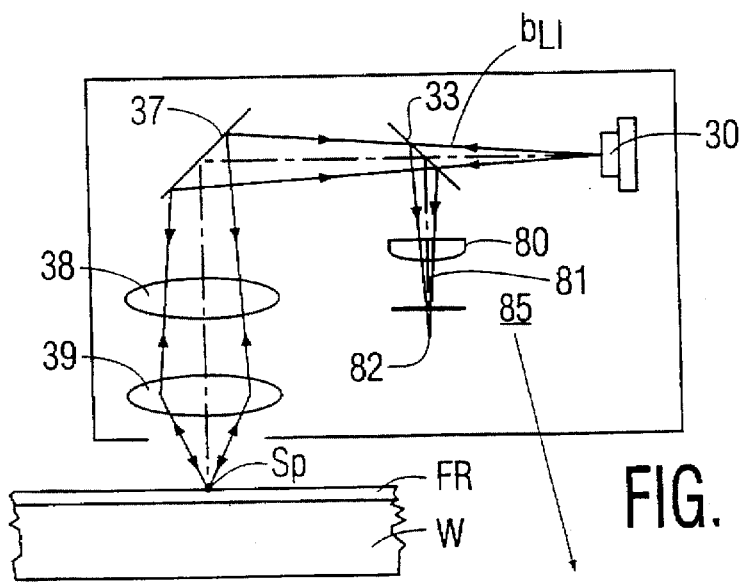
Figure 15B:
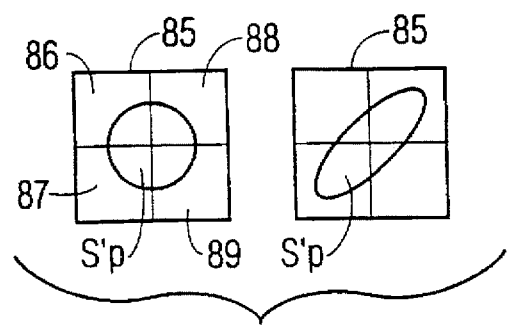

Instead of the Foucault focus-error detection system shown in FIG. 12, the device may alternatively comprise an astigmatic focus-error detection system as is shown in FIG. 15. The path of the reflected beam then incorporates an astigmatic element, for example a cylindrical lens 80. The reflected beam is thereby no longer focused at one point but two astigmatic focal lines 81, 82 which are mutually perpendicular are produced. A quadrant detector 85 comprising four elements 86, 87, 88, 89 is arranged centrally between these focal lines. If the measuring beam $b_{LI}$ is focused on the photoresist layer FR, the radiation spot $S_p$ in the plane of the detector is round, as is shown at the bottom left in FIG. 15. Upon defocusing, the radiation spot $S_p$ becomes elliptical, while the long axis of the ellipse is tilted either to the left or the right, dependent on the sign of defocusing. The focus error signal $S_f$ is now given by:

$$S_f = (S_{86} + S_{89}) - (S_{87} + S_{88})$$

Figure 16A:
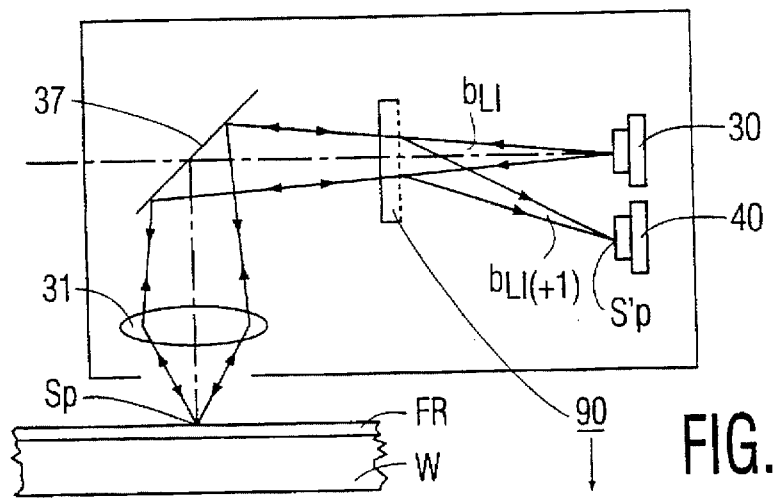
Figure 16B:
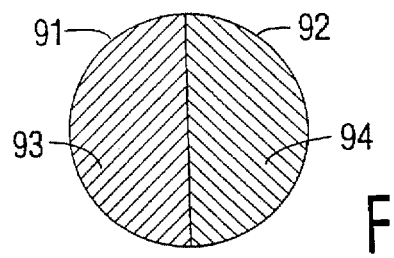

A PI signal or a DPC signal can be obtained again with this device and with the device shown in FIGS. 14 and 16.

FIG. 16 shows an embodiment of the device in which a grating 90 is used as a beam-separating element. This grating passes a part, the zero diffraction order, of the laser beam $b_{LI}$ to the objective lens 31 and deflects a part, viz. a first diffraction order $b_{LI(+1)}$, of the reflected beam $b_{LI}$ to the detector 40 where a radiation spot $S'_p$ is formed again.

If, as shown in the lower part of FIG. 16, the grating comprises two parts 91 and 92, of which one of the parameters determining the deflection angle, the direction of the grating strips 93, 94 or the grating period are different, two sub-beams of the same diffraction order are formed which are deflected at different angles. Then, two radiation spots which are shifted with respect to each other are formed on the detector 40. If this detector comprises four elements, as is shown in FIG. 12, a focus error can be detected again with this device by means of the Foucault method. The grating 90 may alternatively be implemented in such a way that it renders the reflected beam astigmatic so that the astigmatic focus-error detection method can be used again by using a quadrant detector as shown in FIG. 15.

It is essential for the latent-image detection device that it is compact and forms a small radiation spot on the photoresist layer. The specific construction and the way in which the focus error signal is generated is less essential. For this device various read pens or read heads known in the field of optical information storage can be used.

Figure 17:
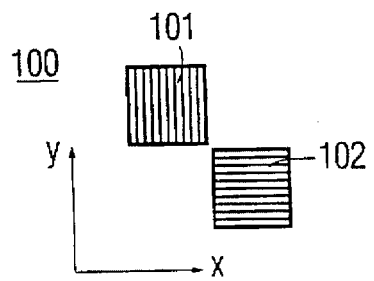
FIGS. 17, 18 and 19 show embodiments of two dimensional test marks.
Figure 18:
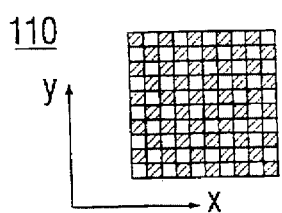

Test marks having a periodical structure in one direction, the X-direction in FIG. 4 have hitherto been discussed. To be able to measure in two directions, a test mark 100 having a periodical structure 101, 102 both in the X-direction and in the Y-direction, as shown in FIG. 17, can be used, or a checkerboard mark, which is shown in FIG. 18, can be used. The images of these marks must be scanned in two directions.

Figure 19:
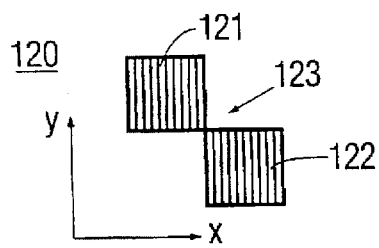

For measuring in two directions, a mark shown in FIG. 19 may also be used. This mark comprises two parts 121, 122 both having a line structure in the X-direction. This mark is scanned several times in the X-direction. After each scanning operation in the X-direction, the scanning spot in the Y-direction is shifted over a distance which is smaller than the height of the elements 121 and 122, until the entire mark has been scanned. Thus the interface 123 in the Y-direction can be detected.

In practice the latent images of three test marks of a mask can be measured. The parameters which are measured are the position of the latent image in the X, Y and Z-directions and the rotation of this image about the X, Y and Z-axes. These positions and rotations are measured with respect to the substrate table, in which the system of coordinates defined by the substrate table position detection device constitutes a reference for the image detection device. The rotation about the Z-axis is the rotation of the image in its own plane. The rotations about the X-axis and the Y-axis represent the tilt of the image along the Y-axis and the X-axis, respectively.

The information, supplied by the latent-image detection device, about the tilt of the image formed with projection light can be used to calibrate tilt detection devices to be built into novel-generation projection apparatuses, which devices operate with radiation other than projection radiation and whose operation is based on the autocollimator principle.

In addition to information about the position, rotation and tilt of the latent image, the image detection device also provides information about the variations in image quality, notably the magnification, astigmatism and third-order distortion occurring as a result of variations of the wavelength of the projection beam and variations of the ambient parameters such as air pressure, temperature and the like. Moreover, the curvature of the image field can be derived from the astigmatism, because the variations of astigmatism and curvature of the image field occurring as a result of varying ambient parameters have a fixed relationship.

The output signal of the latent-image detection device comprises information about the X-position of the latent image of, for example the test mark but also information about the Z-position of this image. To determine the X-position of the image of the mask mark $M_3$, the substrate table is moved in the X-direction at a constant Z, and the intensity of the radiation on the detector is measured as a function of the movement, and the X-position is obtained by comparing the detector output signal with a reference. To determine the focusing (Z-position), the substrate holder is moved in the Z-direction at a constant X and the intensity is measured again as a function of the movement. The detector output signal is compared again with a reference from which the Z-position, $Z_{3,X}$ follows. $Z_{3,X}$ provides information about the focus error at the location of the mark $P_3$ in the X-direction. Analogously, when using two-dimensional marks and when also scanning in the Y-direction, a position signal $Y_3$ and a focus error signal $Z_{3,Y}$ can be obtained. The X and Y-positions of the image of the test mark $M_3$ are then known, as well as the focusing error in the X and Y-directions at the location of the latent image of $M_3$, hence also the astigmatism of the image.

Position signals $X_4$ and $Y_4$ and focus error signals $Z_{4,X}$ and $Z_{4,Y}$ can be obtained in the same manner from the latent image of the test mark $M_4$, while position signals $X_5$ and $Y_5$ and focus error signals $Z_{5,Y}$ can be derived from the latent image of the test mark $M_5$. Since the X, Y and Z-positions of the three marks in the image are then known, the X, Y and Z-positions $P_{T,X}$, $P_{T,Y}$ and $P_{T,Z}$ of the total image formed with projection radiation by the projection lens system are also known.

It is to be noted that $P_{T,X}$ and $P_{T,Y}$ and $P_{T,Z}$ may in principle also be derived from one latent image of a test mark, for example $M_3$. This latent image also provides information about the astigmatism $AS_T$ of the whole image. This position information is not so accurate as the information obtained when measuring on three marks, but under circumstances it is satisfactorily usable.

When the positions of the images of the three test marks are known, the tilt of the image plane $\phi_X$ and $\phi_Y$, i.e. the plane through the three mask mark images about the X-axis and the Y-axis can be determined by comparing the three image positions in the X and Y-direction, respectively.

A rotation of the projection image about the Z-axis has the result that the variations in the X and Y-positions of the different test mark images are opposed. Consequently, the image rotation can be determined by comparing both the X and the Y-positions of the test mark images.

With a magnification error ME in the X and the Y-direction, the image of a test mark, for example $M_3$ is shifted in the opposite sense in the X and the Y-direction, respectively with respect to the image of a second test mark, for example $M_4$. The magnification error can be determined by comparing these shifts of position in the X and Y-directions.

The third-order distortion, or radial distortion $D_3$ may be determined by comparing all position information of the three mark images if the three test marks are located at different distances from the optical axis of the projection lens system PL. If the test marks are located at equal distances from the optical axis, the third-order distortion can be determined by using the information of the substrate table position detection device as a reference.

It is to be noted that it has been shown hereinbefore that the nine relevant parameters $X_T$, $Y_T$, $Z_T$, $\phi_X$, $\phi_Y$, $\phi_Z$, ME, AS and $D_3$ can indeed be measured. In practice, the detector signals themselves can be processed in various manners, using a central computer which compares the detector signals with reference values. Procedures referred to as curve fitting procedures in which measured signal curves are compared with reference curves stored in the computer are preferably used in this case. The result of this comparison yields control signals for the various servodevices of the projection apparatus. It is then not necessary that all parameters influencing the imaging quality, i.e. the ambient parameters, the wavelength of the projection beam, the mechanical drift etc. are exactly known, but the computer can ascertain with reference to the detector signals that the image formed by the projection lens system is not correct and, via a model in which all influencing parameters are incorporated, it can then generate setting signals for the various servodevices and control signals for the meters of the apparatus such as for wavelength, gas pressure and temperature in the projection lens, etc. so that the position and quality of the projected image are optimized.

The latent-image detection device according to the invention can measure and correct accurately. In a projection apparatus with a projection beam whose wavelength is in the far ultraviolet range, for example 248 nm, it must be possible to measure instabilities of the order of 5 nm in the X and Y-directions and instabilities of the order of 50 nm in the Z-direction. In a projection apparatus in which the influencing parameters themselves would be measured and compared with reference values, the temperature, wavelength, Z-position of the mask and air pressure would have to be measured with an accuracy of 0.015° K, 0.5 μm, 0.15 μm and 0.5 mbar, respectively. If it is at all possible to achieve these measuring accuracies, very advanced measuring techniques should be used for this purpose. Moreover, the measuring values should be converted for aberrations of the projection lens system, with the attendant requirement that no inhomogeneities should occur in this system. Moreover, mechanical drift in the projection apparatus is not taken into account.

Figure 20:
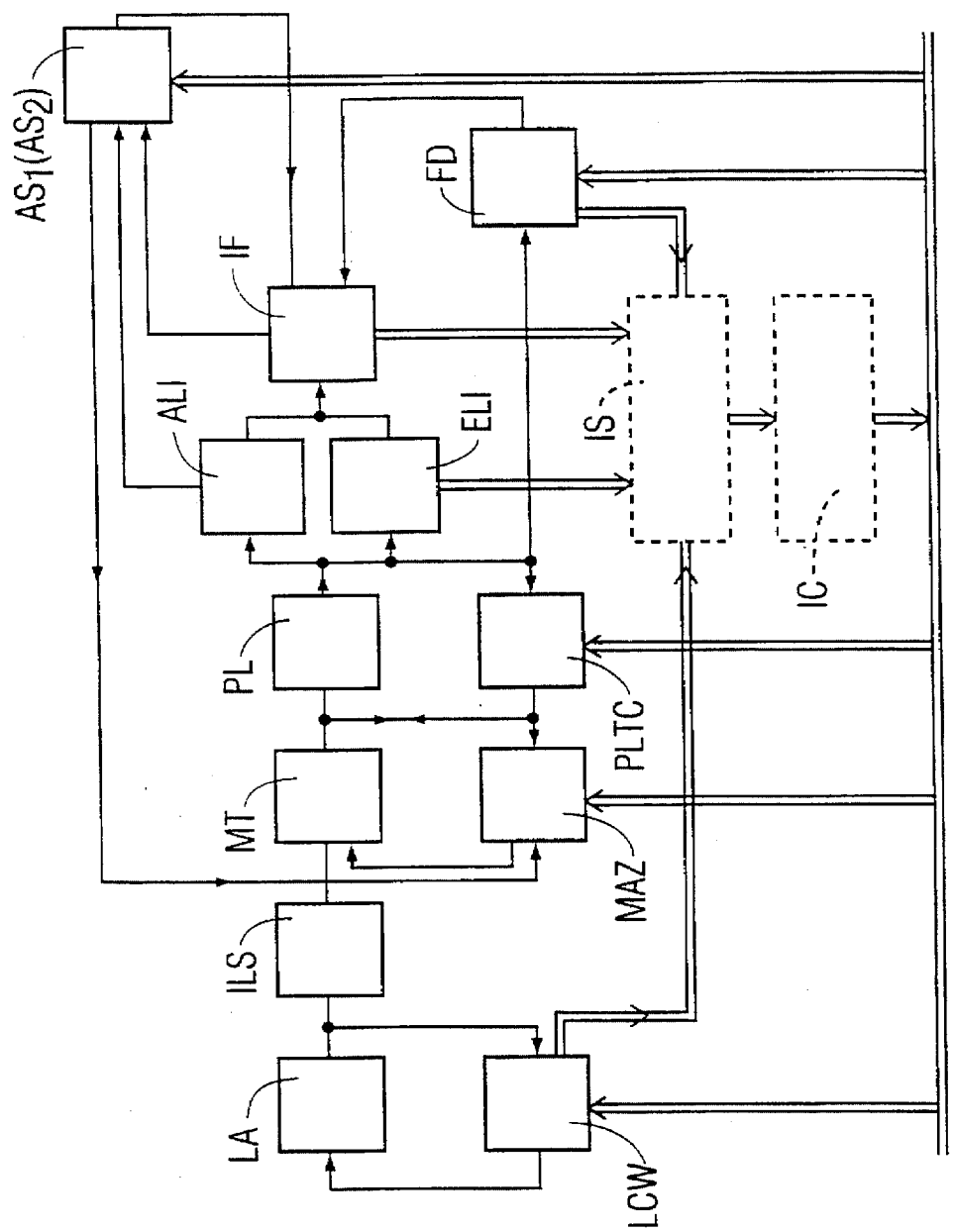
FIG. 20 shows a diagram of the different servodevices of the projection apparatus and the connections between these devices.

FIG. 20 shows a diagram of the servodevices and their interconnections used in the projection apparatus. The single connection lines between the different devices denoted by blocks are also present in known projection apparatuses. These blocks are:

LA, the radiation source, for example a laser,

LWC, a laser wavelength control device,

ILS, the illumination system,

MT, the mask table,

MAZ, a device controlling the Z-position of the mask table,

PL, the projection lens,

PLTC, a device controlling the temperature of the projection lens,

ALI, the image formed with alignment radiation,

IF, the substrate table position detection device,

FD, the focus detection device, $AS_1$ ($AS_2$), the single (or double) aligning device.

The sub-systems denoted by broken lines are arranged as extra systems in the projection apparatus:

ELI, the latent image formed with the projection radiation,

IS, the latent-image detection device, and

IC, the image calibration device, or the computer.

The extra signals which are processed when using the latent-image detection device are denoted by means of the double connection lines.

These signals are:

the signals of the substrate table position detection device IF, the wavelength control device LWC and the focus-error detection device FD, which signals are applied to the image detection device;

the image information of the image formed with projection light;

signals of the image calibration device which are applied to the laser wavelength control device LWC, the mask height control device MAZ, the projection lens temperature control device PLTC, the focus-error detection device, and the aligning device $AS_1$ ($AS_2$).

The projection apparatus may comprise one or more of the following devices:

a device (PLPC) for controlling the pressure in the projection lens system;

a device (PLGM) for controlling the composition of the medium in the projection lens system;

a device (PLDC) for controlling the mutual distances between the lens elements.

The devices PLPC, PLGM and PLDC are controlled from the device IC in a manner analogous to that for the device PLTC.

We claim:

1. A method of repetitively imaging a mask pattern, provided in a mask table, on a substrate provided in a substrate table, by means of a projection beam, which method comprises the following steps:

providing a mask having at least one test mark in the mask table;

providing a substrate having a photoresist layer in the substrate table;

projecting the image of at least one test mark of the mask in the photoresist layer by means of the projection beam and the projection lens system;

aligning the mask with respect to the substrate by means of an alignment device;

detecting the latent image of at least one test mark by means of a latent-image detection device in which non-actinic radiation is used;

setting at least one parameter influencing the quality and position of the mask pattern image by means of the output signal of the latent-image detection device, and repetitively imaging a production mask pattern at consecutive, different positions on a production substrate, characterized in that a diffraction-limited scanning spot is used for the latent-image detection and in that said spot and the latent image are moved with respect to each other for point-by-point scanning of the latent image.

2. A method as claimed in claim 1, characterized in that a production mask provided with at least one test mark is used for the latent-image detection.

3. A method as claimed in claim 1, characterized in that a test mask provided with at least one test mark is used for the latent-image detection.

4. A method as claimed in claim 1, characterized in that a plurality of images of a test mark is formed in the photoresist layer, each time at a different focus setting of the projection lens system, and in that the optimum focus of the projection lens system is determined from the variation of the outputs signal of the latent-image detection device obtained when scanning each of said images.

5. A method as claimed in claim 4, characterized in that the optimum focusing signal obtained via the latent-image detection is compared with a focus-measuring signal obtained by means of a separate focus-measuring device and used for calibrating the last-mentioned signal.

6. A method as claimed in claim 1, characterized in that a plurality of images of a test mark is formed in the photoresist layer, each time with a different exposure dose, in that the optimum exposure dose is determined by measuring the variation of the output signals of the latent-image detection device obtained when each scanning of said images, and in that the information thus obtained is used for setting the exposure dose for the production projection process.

7. A method as claimed in claim 1, characterized in that a plurality of images of a test mark is formed in a plurality of areas of the photoresist layer, at the edges of said layer, each time at a different focus setting of the projection lens system, in that the optimum focusing value is determined for each of said areas by measuring the variation of the output signals of the latent-image detection device obtained when scanning each of said images in said areas, and in that the optical properties of the projection lens system are determined by comparing the optimum focusing values for the different areas.

8. A method as claimed in claim 1, characterized in that at least one latent image is formed in the photoresist layer, each at a defined position, and a first alignment signal representing the extent to which the mask and the substrate are aligned with respect to each other is generated by means of these images and the latent-image detection device, and in that said alignment signal is compared with a second alignment signal originating from a separate aligning device and is used for calibrating the last-mentioned device.

9. A method as claimed in claim 8, characterized in that the latent-image detection device is used for scanning at least one alignment mark on the substrate during the alignment calibration procedure.

10. A method as claimed in claim 7, in which use is made of a latent-image detection device which is provided with an autofocusing system with which the position of an objective system within the device is adapted to the distance between an end face of the device and the photoresist layer, characterized in that the detection device and a photoresist layer which is not provided with images are moved with respect to each other in a plane perpendicular to the optical axis of the detection device, and in that a tilt of the photoresist layer with respect to said plane is determined from a movement of the objective system along its optical axis.

11. An apparatus for repetitively projecting a mask pattern on a substrate, which apparatus successively comprises an illumination system for supplying a projection beam, a mask table, a projection lens system and a substrate table and which is further provided with an alignment device for aligning the mask with respect to the substrate and a latent-image detection device, characterized in that the latent-image detection device is constituted by a scanning optical microscope comprising a radiation source supplying a non-actinic test beam, an objective system for focusing the test beam to a diffraction limited scanning spot in a photoresist layer present on the substrate, scanning spot position detection means for detecting the position of the scanning spot in the plane of the photoresist layer, and a radiation-sensitive detection system having at least one detector whose surface area is of the order of the image of the scanning spot formed in the detector plane, said detection system being intended for converting the test beam radiation from the photoresist layer into an electric signal which represents the local refractive index of the photoresist layer at the location of the scanning spot.

12. An apparatus as claimed in claim 11, characterized in that the radiation source of the latent-image detection device is a semiconductor diode laser, the objective system is constituted by a single lens element, at least one refractive surface of which is aspherical, and in that the radiation path between the diode laser and the objective system incorporates a beam-separating element for separating the test beam radiation, reflected by the substrate, from the radiation supplied by the diode laser and for directing the reflected radiation towards the detection system.

13. An apparatus as claimed in claim 11, characterized in that a production substrate table is coupled to a position detection device for detecting positions along at least two mutually perpendicular axes and rotations about these axes, and in that the output signals of the position detection means, of the image detection device, of an aligning detection device and of a focus-error detection device are connected to the inputs of an electronic signal processing device which supplies control signals for correcting one or more of the following parameters:

the wavelength of the projection beam;

the pressure within the projection lens holder;

the mutual distances between the lens elements of the projection lens system;

the composition of the medium in one or more of the compartments of the projection lens holder;

the temperature within the projection lens holder;

the zero-setting of the aligning device;

the zero-setting of the focusing device;

the magnification of the projection lens system.

14. An apparatus as claimed in claim 11 wherein the scanning spot detection means is comprised of a multi-axis interferometer system that detects a position of a production substrate with respect to a production mask during a production projection process.

* * * * *